US006963167B2

(12) United States Patent
Wu et al.

(10) Patent No.: US 6,963,167 B2
(45) Date of Patent: Nov. 8, 2005

(54) ELECTRODE STRUCTURE FOR A LIGHT-EMITTING ELEMENT

(75) Inventors: Bor-Jen Wu, Taipei (TW); Mei-Hui Wu, Chia-I (TW); Yuan-Hsiao Chang, Taipei (TW); Chien-An Chen, Hsin-Chuang (TW)

(73) Assignee: Uni Light Technology Inc., Kuei-Shan Hsiang (TW)

( * ) Notice: Subject to any disclaimer, the term of this patent is extended or adjusted under 35 U.S.C. 154(b) by 124 days.

(21) Appl. No.: 10/733,408

(22) Filed: Dec. 12, 2003

(65) Prior Publication Data

US 2005/0127817 A1 Jun. 16, 2005

(51) Int. Cl.$^7$ .......... H01J 1/62
(52) U.S. Cl. .......... 313/500; 313/498; 313/505
(58) Field of Search .......... 313/491, 498, 313/500, 503, 505, 506, 574, 631, 326

(56) References Cited

U.S. PATENT DOCUMENTS 4,185,229 A * 1/1980 Yoshikawa et al. ...... 315/169.4

* cited by examiner

*Primary Examiner*—Vip Patel
(74) *Attorney, Agent, or Firm*—Birch Stewart Kolasch & Birch LLP

(57) ABSTRACT

An electrode structure for a light-emitting element includes a first electrode and a second electrode. The first electrode has a plurality of first fingers paralleling with each other, a first connective part, and at least a first contact part. Each first finger has a first end and a second end. Pluralities of first ends connect to the first connective part. The first contact part interposes between any first end and the first connective part. The second electrode has a plurality of second fingers paralleling with each other, a second connective part, and at least a second contact part. Each second finger has a third end and a fourth end, and any second finger is between and parallels to any two first fingers. Pluralities of third ends connect to the second connective part. The second contact part interposes between any third end and the second connective part. The second electrode defines a plurality of hexagonal units among a plurality of second ends. Each hexagonal unit shares its four sides to its adjacent hexagonal units, and the four sides include two of the second fingers and the second connective part. Each second end extends to the center of each hexagonal unit.

12 Claims, 2 Drawing Sheets

ELECTRODE STRUCTURE FOR A LIGHT-EMITTING ELEMENT

BACKGROUND OF THE INVENTION

1. Field of the Invention

This invention generally relates to the electrode structure of a light-emitting element. More particularly, the present invention provides an electrode structure defined by continuous hexagonal structures to equalize the current density and the light-emitting intensity in the light-emitting element.

2. Description of the Prior Art

Since GaN possesses a wide band gap (Eg=3.4 eV in room temperature) and its spectrum area is near to the wavelength of blue light, GaN is a kind of suitable material for manufacturing short wavelength light-emitting devices, and it further becomes one of the most popular material for developing photoelectric elements. Nowadays, through being continually researched and developed, GaN can epitaxially grow more steadily on a sapphire. Moreover, GaN can be utilized in making short wavelength light-emitting devices as long as it passes through a suitable epitaxial growth and electrode arrangement.

Referring to FIG. 1, a top view of the schematic electrode structure of a well-known light-emitting device is illustrated. While an external voltage is applied to a first electrode 110 through a contact pad, currents flow into the light-emitting device. The currents pass forward through the internal heterogeneous junction, such as a P/N junction, and make the light-emitting device luminescent due to energy conversion resulted from minor carriers recombining. Then, the currents converge on a second electrode 120 via different current paths, such as current paths 112, 114, and 116, etc., and flow out the light-emitting device by another contact pad. However, the distances of the current paths from the first electrode 110 to the second electrode 120 are not equidistant. This situation makes the current density in the light-emitting device inconsistent and further results in different light-emitting intensity. This is because the current density is an inverse ratio to the length of the current path, and the light-emitting intensity is a direct proportion to the current density. For example, the current density on edge current paths 112 and 116 is lower than the current density on a central current path 114, since the edge current paths 112 and 116 are longer than the central current path 114. Therefore, the light-emitting intensity on the edges of the light-emitting device is not as light as it is on the center. In addition, the inconsistent current density is one of the main factors in poor reliability in the light-emitting device.

In order to increase the brightness of the light-emitting device, the GaN light-emitting devices have gradually developed toward the field of high power and big area elements. As shown in FIG. 2, a top view of a schematic finger-interlaced electrode structure is illustrated. The kind of finger-interlaced electrode structure is commonly used for the high power semiconductor elements. A first electrode 150 vertically connects to extending electrodes 150-1 and 150-2, which parallel to each other, to form a finger electrode structure. A second electrode 160 also vertically connects to extending electrodes 160-1, 160-2 and 160-3, which parallel to each other, to form another finger electrode structure. A so-called finger-interlaced electrode structure is formed through paralleling and interlacing the extending electrodes 160-1, 150-1, 160-2, 150-2, and 160-3. The finger-interlaced electrode structure makes each extending electrode have the same distance to its adjacent extending electrodes. Thus, the distances of current paths for currents flowing from any extending electrode to its adjacent extending electrodes are equidistant, so as to equalize the current density and the light-emitting intensity in a light-emitting device. However, the problem is the resistance on the extending electrode is a direct proportion to the distance to the electrode. For example, the resistance for point B to the first electrode 150 is bigger than the resistance for point A to the first electrode 150. This means the current intensity and density on point B are lower than those on point A, and hence, the light-emitting intensity around point B is weaker than around point A.

In view of the drawbacks mentioned with the prior art of electrode structures, there is a continued need to develop a new and improved structure that overcomes the disadvantages associated with the prior art of electrode structures. The advantages of this invention are that it solves the problems mentioned above.

SUMMARY OF THE INVENTION

In accordance with the present invention, an electrode structure for equalizing the current density and the light-emitting intensity of a light-emitting element substantially obviates one or more of the problems resulted from the limitations and disadvantages mentioned in the background of the prior art.

Accordingly, one object of the present invention is to provide an electrode structure defined by a hexagonal structure to make the current paths between the first electrode and the second electrode equidistant.

Another object is to provide an electrode structure defined by a hexagonal structure to equalize the distance resistance between the electrode and the extending electrode.

According to the aforementioned objects, the present invention provides an electrode structure for equalizing the current density and the light-emitting intensity in a light-emitting element. The electrode structure includes a first electrode and a second electrode. The first electrode has a plurality of first fingers paralleling with each other, a first connective part, and at least a first contact part. Each first finger has a first end and a second end. Pluralities of first ends connect to the first connective part. The first contact part interposes between any first end and the first connective part. The second electrode has a plurality of second fingers paralleling with each other, a second connective part, and at least a second contact part. Each second finger has a third end and a fourth end, and any second finger is between and parallels to any two first fingers. Pluralities of third ends connect to the second connective part. The second contact part interposes between any third end and the second connective part. The second electrode defines a plurality of hexagonal units among a plurality of second ends. Each hexagonal unit shares its four sides to its adjacent hexagonal units, and the four sides include two of the second fingers and the second connective part. Each second end extends to the center of each corresponding hexagonal unit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Moreover, some irrelevant details are not drawn in order to make the illustrations concise and to provide a clear description for easily understanding the present invention.

The present invention provides an electrode structure for equalizing the current density and the light-emitting intensity in a light-emitting element. The electrode structure includes a first electrode and a second electrode. The first electrode has a plurality of first fingers paralleling with each other, a first connective part, and at least a first contact part. Each first finger has a first end and a second end. Pluralities of first ends connect to the first connective part. The first contact part interposes between any first end and the first connective part. The second electrode has a plurality of second fingers paralleling with each other, a second connective part, and at least a second contact part. Each second finger has a third end and a fourth end, and any second finger is between and parallels to any two first fingers. Pluralities of third ends connect to the second connective part. The second contact part interposes between any third end and the second connective part. The second electrode defines a plurality of hexagonal units among a plurality of second ends. Each hexagonal unit shares its four sides to its adjacent hexagonal units, and the four sides include two of the second fingers and the second connective part. Each second end extends to the center of each corresponding hexagonal unit.

Figure 1:
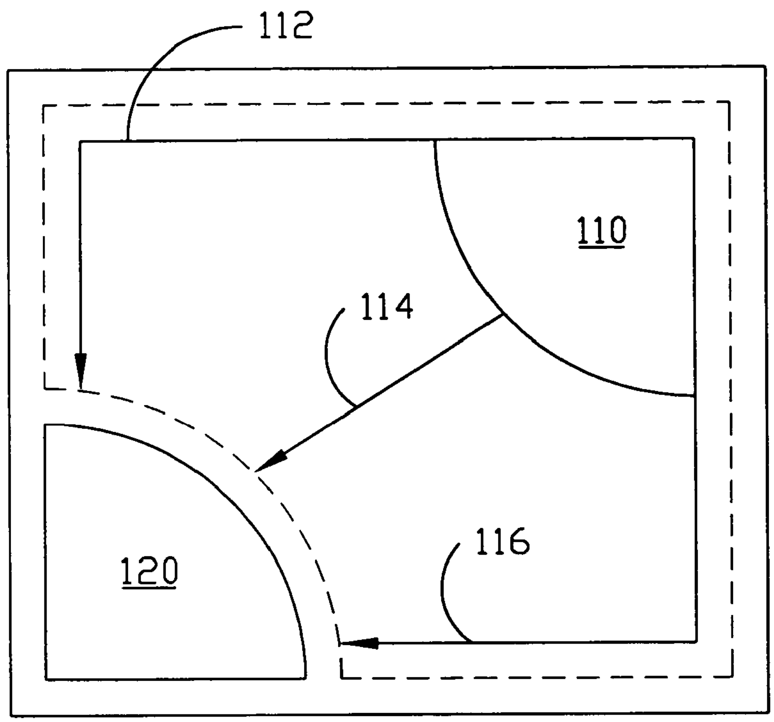
FIG. 1 illustrates a top view of the schematic electrode structure of a well-known light-emitting device.
Figure 2:
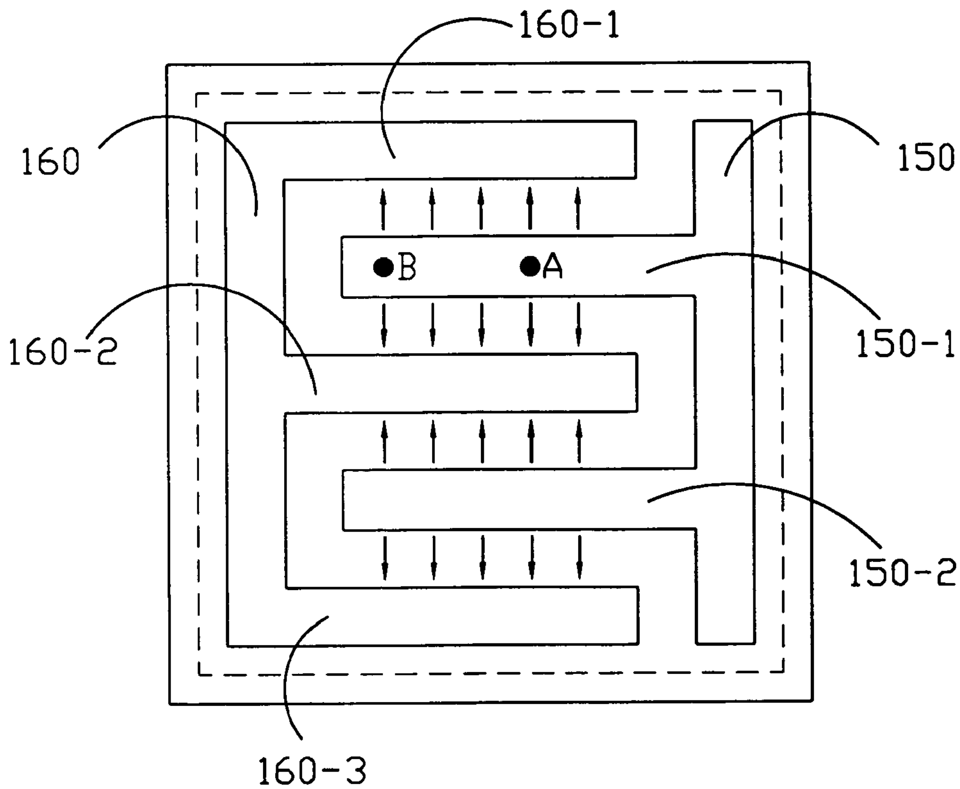
FIG. 2 illustrates a top view of the schematic finger-interlaced electrode structure of another well-known light-emitting device.
Figure 3A:
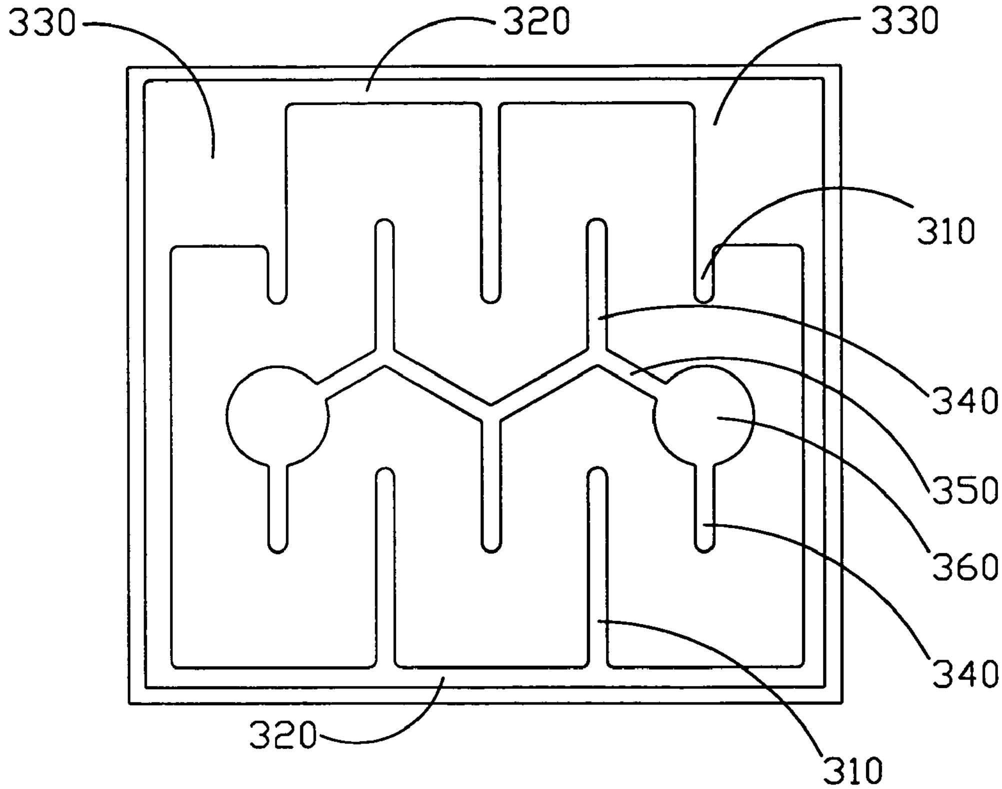
FIG. 3A illustrates a preferred electrode structure embodiment in accordance with the present invention.

Referring to FIG. 3A, a preferred electrode structure example in accordance with the present invention is illustrated. A first electrode, such as the P or the N electrode of a light-emitting diode (LED), has a plurality of first fingers 310 paralleling with each other, a first connective part 320 connecting to the bases of the plurality of first fingers 310, and at least a first contact part 330. Wherein, the first contact part 330 could be interposed between the base of any first finger 310 and the first connective part 320. In this embodiment, two rectangular first contact parts 330 are interposed between the first fingers 310 and the first connective parts 320 at intervals to form two contact pads. However, it should be understood that the first contact parts should not be limited to the rectangular geometric shape, and any geometric shape can replace the rectangular geometric shape.

A second electrode, such as the N or the P electrode of a light-emitting diode, has a plurality of second fingers 340 paralleling with each other, a second connective part 350 connecting to the bases of the plurality of second fingers 340, and at least a second contact part 360. Wherein, the tops of the second fingers 340 are paralleled and interlaced to any two adjacent first fingers 310, and the second contact part 360 could be interposed between the base of any second finger 340 and the second connective part 350. In the present embodiment, two circular second contact parts 360 are respectively interposed between the bases of the second fingers 340 and the connective parts 350 at both sides to form two contact pads. Similarly, the second contact parts should not be limited to the circular geometric shape, and any geometric shape can replace the circular geometric shape.

Figure 3B:
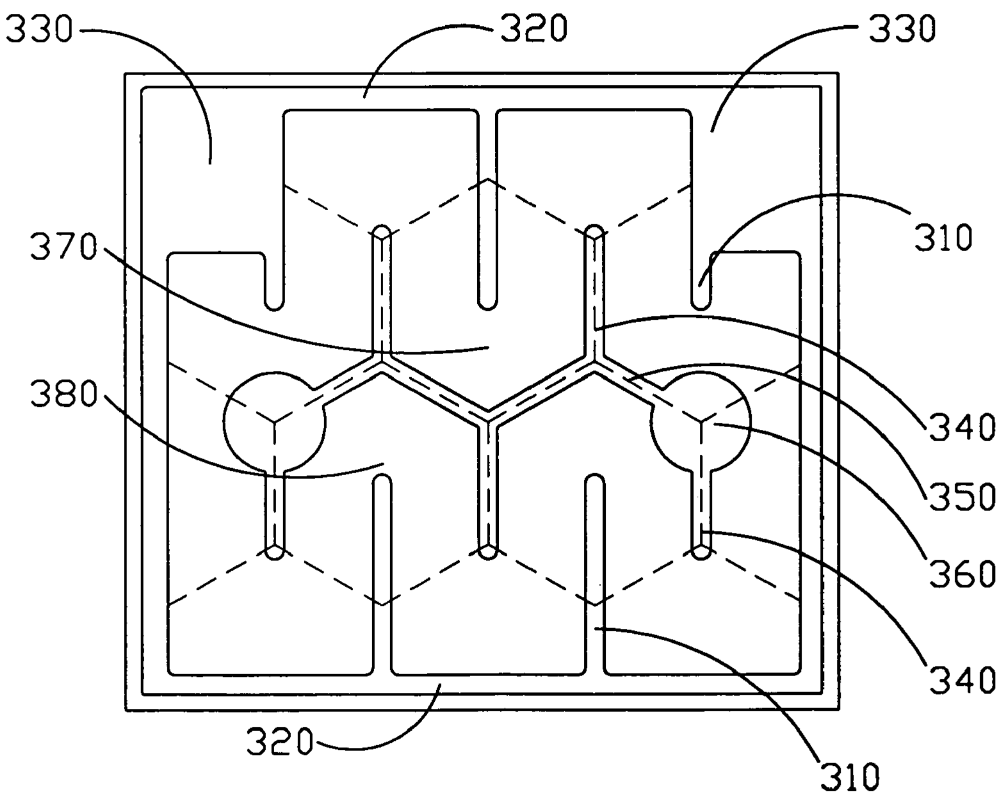
FIG. 3B illustrates defined hexagonal units with the preferred electrode structure shown in FIG. 3A.

Moreover, the second electrode defines a plurality of hexagonal units 370 and 380 among the tops of the first fingers 310, as shown in FIG. 3B. Each hexagonal unit 370 and 380 shares its four sides, such as two adjacent second fingers 340 having the same direction and the connective part 350 connecting to two of the second fingers 340, to its adjacent hexagonal units 370 and 380. And, the four sides could further have the second contact part 360. In the present embodiment, the four sides of each hexagonal unit 370 have zero to one of the second contact parts 360, and the four sides of each hexagonal unit 380 have one of the second contact part 360. Besides, the top of each first finger 310 is extended to the center of each corresponding hexagonal unit 370 and 380.

In other words, the fingers, the connective parts, and the contact parts described above are defined and arranged according to a continuous hexagonal structure. Please refer to FIG. 3B again, the base of each second finger 340 is formed on each apex between the hexagonal units 370 and 380, and the top of each second finger 340 is respectively extended along the common side of any two hexagonal units 370 and of any two hexagonal units 380. The second connective part 350 is formed on the common sides between the hexagonal units 370 and 380. The base of each first finger 310 is formed on each opposite apex to the base of each second finger 340, and the top of each first finger 310 is respectively extended to the center of each corresponding hexagonal unit 370 and 380 by paralleling to the second fingers 340. By doing so, between every two adjacent second fingers 340 with the same direction, a first finger 310 exists and parallels to them. In other words, between every two adjacent first fingers 310, a second finger 340 comparatively exists and parallels to them.

Since the length of each side of the hexagonal units 370 and 380 is the same and the distances between the first finger 310 and the second finger 340 are similar to each other, the first contact parts 330 and the second contact parts 360 can be interposed to the apexes of the hexagonal units 370 and 380 through a preferred layout. This makes the current paths between two electrodes similar to each other, and further equalizes the distance resistance between the electrode and the extending electrode. The above-mentioned preferred layout is based on the considerations of current diffusion and light transmission. For example, the current limitation of a general bonding line is usually smaller than the practical application current of the high power light-emitting device. Thus, increasing the contact parts and the boding lines can distribute the practical application current into different current path to avoid the damage resulted from the over current. However, too many contact parts also make the light-emitting device have poor light-emitting efficiency because the internal light is blocked by the contact parts and cannot be transmitted out. The present invention decides the numbers of the contact parts according to the above-mentioned considerations. Herein, the numbers of contact parts are not necessarily matched, that is, the numbers of the first contact parts could be more than the numbers of the second contact parts, vice versa.

In summary, the present invention emphasizes a continuous hexagonal layout and structure applied to the electrode structure of a light-emitting element, such as a light-emitting diode (LED). Through employing the distance of each adjacent apex of the hexagon being equidistant, the present invention solves the different resistance resulted from different distances between the electrode and the extending electrode. By taking advantage of the distances among the center and the apexes of the hexagon being equal to each other, the present invention makes the current paths between two electrodes equidistant. Besides, through the regular hexagonal pattern, the present invention makes the whole chip area have the most effective area utilization in order to solve the area utilization problem caused by an asymmetric electrode structure. In a word, under taking account of the uniformity of the current density and the light-emitting intensity, and the area utilization on the whole chip area, the hexagonal electrode structure can meet the above-mentioned requirements and also is within the spirit of the present invention.

Although specific embodiments have been illustrated and described, it will be obvious to those skilled in the art that various modifications may be made without departing from what is intended to be limited solely by the appended claims.

What is claimed is:

1. An electrode structure for a light-emitting element, said electrode structure comprising:

a first electrode having a plurality of first fingers paralleling with each other, a first connective part, and at least one first contact part, wherein each said plurality of first fingers has a first end and a second end, said plurality of first ends connect to said first connective part, said first contact part interposes between any said first end and said first connective part; and a second electrode having a plurality of second fingers paralleling with each other, a second connective part, and at least one second contact part, wherein each said plurality of second fingers has a third end and a fourth end and is between any said two adjacent first fingers, said plurality of third ends connect to said second connective part, said second contact part interposes between any said third end and said second connective part, wherein said second electrode defines a plurality of hexagonal units among said plurality of second ends, each said plurality of hexagonal units shares four sides to adjacent hexagonal units and said four sides include two said second fingers and said second connective part, each said second end extends to a center of each said hexagonal unit.

2. The electrode structure according to claim 1, wherein said plurality of first fingers paralleling with each other are paralleled and interlaced to said plurality of second fingers paralleling with each other.

3. The electrode structure according to claim 1, while there are plurality of said first contact parts, each said first contact part interposes between any said first end and said first connective part at intervals.

4. The electrode structure according to claim 1, while there are plurality of said second contact parts, each said second contact part interposes between any said third end and said second connective part at intervals.

5. The electrode structure according to claim 1, wherein said four sides further include an odd number of said second contact part.

6. The electrode structure according to claim 1, wherein said four sides further include an even number of said second contact part.

7. An electrode structure for a light-emitting diode (LED), said electrode structure comprising:

a first electrode having a plurality of first fingers paralleling with each other, a first connective part, and at least one first contact part, wherein each said plurality of first fingers has a first end and a second end, said plurality of first ends connect to said first connective part, said first contact part interposes between any said first end and said first connective part; and a second electrode having a plurality of second fingers paralleling with each other, a second connective part, and at least one second contact part, wherein each said plurality of second fingers has a third end and a fourth end and is between any said two adjacent first fingers, said plurality of third ends connect to said second connective part, said second contact part interposes between any said third end and said second connective part;

wherein said second electrode defines a plurality of hexagonal units among said plurality of said second ends, each said plurality of hexagonal units shares four sides to adjacent hexagonal units and said four sides include two said second fingers and said second connective part, each said second end extends to a center of each said hexagonal unit.

8. The electrode structure according to claim 7, wherein said plurality of first fingers paralleling with each other are paralleled and interlaced to said plurality of second fingers paralleling with each other.

9. The electrode structure according to claim 7, while there are plurality of said first contact parts, each said first contact part interposes between any said first end and said first connective part at intervals.

10. The electrode structure according to claim 7, while there are plurality of said second contact parts, each said second contact part interposes between any said third end and said second connective part at intervals.

11. The electrode structure according to claim 7, wherein said four sides further include an odd number of said second contact part.

12. The electrode structure according to claim 7, wherein said four sides further include an even number of said second contact part.

* * * * *